(12) United States Patent
Sasaki

(10) Patent No.: US 7,170,217 B2
(45) Date of Patent: Jan. 30, 2007

(54) STACK-TYPE PIEZOELECTRIC DEVICE

(75) Inventor: Satoshi Sasaki, Akita (JP)

(73) Assignee: TDK Corporation, Tokyo (JP)

( * ) Notice: Subject to any disclaimer, the term of this patent is extended or adjusted under 35 U.S.C. 154(b) by 256 days.

(21) Appl. No.: 11/015,699

(22) Filed: Dec. 20, 2004

(65) Prior Publication Data

US 2005/0162044 A1    Jul. 28, 2005

(30) Foreign Application Priority Data

Dec. 26, 2003 (JP) .......................... P2003-433915

(51) Int. Cl.
*H01L 41/083* (2006.01)
*H01L 41/047* (2006.01)
*H02N 2/00* (2006.01)

(52) U.S. Cl. ..................................... 310/366
(58) Field of Classification Search ................ 310/328, 310/366
See application file for complete search history.

(56) References Cited

U.S. PATENT DOCUMENTS

| | | | |
|---|---|---|---|
| 5,345,137 A * | 9/1994 | Funakubo et al. ..... | 310/323.16 |
| 5,382,865 A * | 1/1995 | Butcher et al. ............. | 310/366 |
| 5,693,998 A * | 12/1997 | Fujimoto et al. ........... | 310/366 |
| 5,828,160 A * | 10/1998 | Sugishita .................... | 310/366 |
| 6,046,526 A * | 4/2000 | Maruyama ............. | 310/323.06 |
| 6,864,620 B2 * | 3/2005 | Takeuchi et al. ............ | 310/334 |
| 6,986,189 B2 * | 1/2006 | Kitahara ..................... | 29/25.35 |

FOREIGN PATENT DOCUMENTS

| | | | |
|---|---|---|---|
| JP | A 2000-261055 | | 9/2000 |
| JP | A 2001-260349 | | 9/2001 |
| JP | A 2002-254634 | | 9/2002 |
| JP | 2005-191450 | * | 7/2005 |

* cited by examiner

*Primary Examiner*—Thomas M. Dougherty
(74) *Attorney, Agent, or Firm*—Oliff & Berridge, PLC

(57) ABSTRACT

A stack-type piezoelectric device is provided in a configuration wherein an inactive layer is placed between an active layer with internal electrodes therein and a piezoelectric layer with terminal electrodes therein, and wherein the internal electrodes and the terminal electrodes can be securely electrically connected through through holes (THs) formed in the inactive layer.

In a stack-type piezoelectric device 1, an inactive layer 14 placed between an active layer 6 with anodic electrodes 2 and cathodic electrodes 4 as internal electrodes and a piezoelectric layer 9 with terminal electrodes 7, 8 is comprised of a stack of a plurality of piezoelectric layers 13 in each of which THs 11, 12 are formed. This permits each piezoelectric layer 13 to be formed in such a thickness that an electroconductive member 23 can be securely placed in each TH 11, 12, and the inactive layer 14 can be constructed of a stack of a plurality of such piezoelectric layers 13. In this configuration, the electroconductive members 23 can be securely placed in THs 11, 12, and it is thus feasible to securely electrically connect the anodic electrodes 2 to the terminal electrode 7 and the cathodic electrodes 4 to the terminal electrode 8.

2 Claims, 14 Drawing Sheets

STACK-TYPE PIEZOELECTRIC DEVICE

BACKGROUND OF THE INVENTION

1. Field of the Invention

The present invention relates to a stack-type piezoelectric device used as a drive source in control of a valve of a micropump or the like.

2. Related Background Art

An example of the conventional stack-type piezoelectric devices is the one described in Japanese Patent Application Laid-Open No. 2002-254634. This stack-type piezoelectric device has an active layer consisting of an alternate stack of piezoelectric layers in each of which a number of individual electrodes are formed, and piezoelectric layers in each of which a common electrode is formed. This active layer is displaced in the stack direction when a voltage is applied between the individual electrodes and the common electrodes. A layer laid at one end in the stack direction is a piezoelectric layer in which a number of terminal electrodes for applying the voltage between the individual electrodes and the common electrodes are formed.

In the stack-type piezoelectric device of this type, a driven object such as a valve of a micropump is attached to a piezoelectric layer at the other end in the stack direction. When the voltage is applied through the terminal electrodes between a plurality of individual electrodes aligned in the stack direction and the common electrodes, active parts corresponding to the plurality of individual electrodes in the active layer (portions to be distorted by piezoelectric effect in the piezoelectric layers) are displaced in the stack direction to actuate the driven object.

For this reason, it is important to securely transmit the displacement of the active layer to the other end side in the stack direction (i.e., the side where the driven object is to be attached) and, for implementing it, there are cases where an inactive layer is laid between the active layer with the internal electrodes such as the individual electrodes and the common electrodes, and the piezoelectric layer with the terminal electrodes.

SUMMARY OF THE INVENTION

Incidentally, an increase in the thickness of the inactive layer is effective for securely transmitting the displacement of the active layer to the other end side in the stack direction. However, where the internal electrodes and the terminal electrodes are connected by electroconductive members through through holes formed in the inactive layer, it becomes more difficult to fill the electroconductive member in each through hole with increase in the thickness of the inactive layer, and there is a risk of failing in securing electrical connection between the internal electrodes and the terminal electrodes.

The present invention has been accomplished in view of such circumstances and an object of the present invention is therefore to provide a stack-type piezoelectric device in a configuration wherein an inactive layer is placed between an active layer with internal electrodes and a piezoelectric layer with terminal electrodes, and wherein the internal electrodes and the terminal electrodes can be securely electrically connected through through holes formed in the inactive layer.

In order to achieve the above object, a stack-type piezoelectric device according to the present invention is a stack-type piezoelectric device comprising: an active layer consisting of an alternate stack of first piezoelectric layers in each of which a first internal electrode is formed, and second piezoelectric layers in each of which a second internal electrode is formed, the active layer being displaced in a stack direction when a voltage is applied between the first internal electrode and the second internal electrode; and a third piezoelectric layer in which a first terminal electrode for applying a voltage to the first internal electrode, and a second terminal electrode for applying a voltage to the second internal electrode are formed, wherein an inactive layer is placed between the active layer and the third piezoelectric layer, and wherein the inactive layer comprises a stack of a plurality of fourth piezoelectric layers in each of which a first through hole for electrical connection between the first internal electrode and the first terminal electrode, and a second through hole for electrical connection between the second internal electrode and the second terminal electrode are formed.

In this stack-type piezoelectric device, the inactive layer placed between the active layer with the internal electrodes and the third piezoelectric layer with the terminal electrodes comprises the stack of the plurality of fourth piezoelectric layers with the through holes for electrical connection between the internal electrodes and the terminal electrodes. For this reason, each fourth piezoelectric layer can be formed in such a thickness that an electroconductive member can be securely placed in each through hole, and by stacking a plurality of such fourth piezoelectric layers, the inactive layer can be constructed in such a thickness that the displacement of the active layer can be securely transmitted to the side opposite to the third piezoelectric layer in the stack direction (i.e., to the side where a driven object is attached). This results in securely placing the electroconductive members in the through holes formed in the inactive layer, and, in turn, the internal electrodes and the terminal electrodes can be securely electrically connected through the through holes formed in the inactive layer. Here the inactive layer means a piezoelectric layer that is not displaced in the stack direction even with application of the voltage between the first internal electrode and the second internal electrode.

Preferably, each fourth piezoelectric layer comprises a first relay electrode connected to an electroconductive member in the first through hole, and a second relay electrode connected to an electroconductive member in the second through hole. This permits through holes adjacent in the stack direction through a relay electrode to be formed as shifted within the region of the relay electrode (so as not to be aligned on a straight line), whereby the electroconductive members in the through holes adjacent in the stack direction can be securely connected to the relay electrode.

DESCRIPTION OF THE PREFERRED EMBODIMENTS

The preferred embodiments of the stack-type piezoelectric device according to the present invention will be described below in detail with reference to the drawings.

[First Embodiment]

Figure 1:
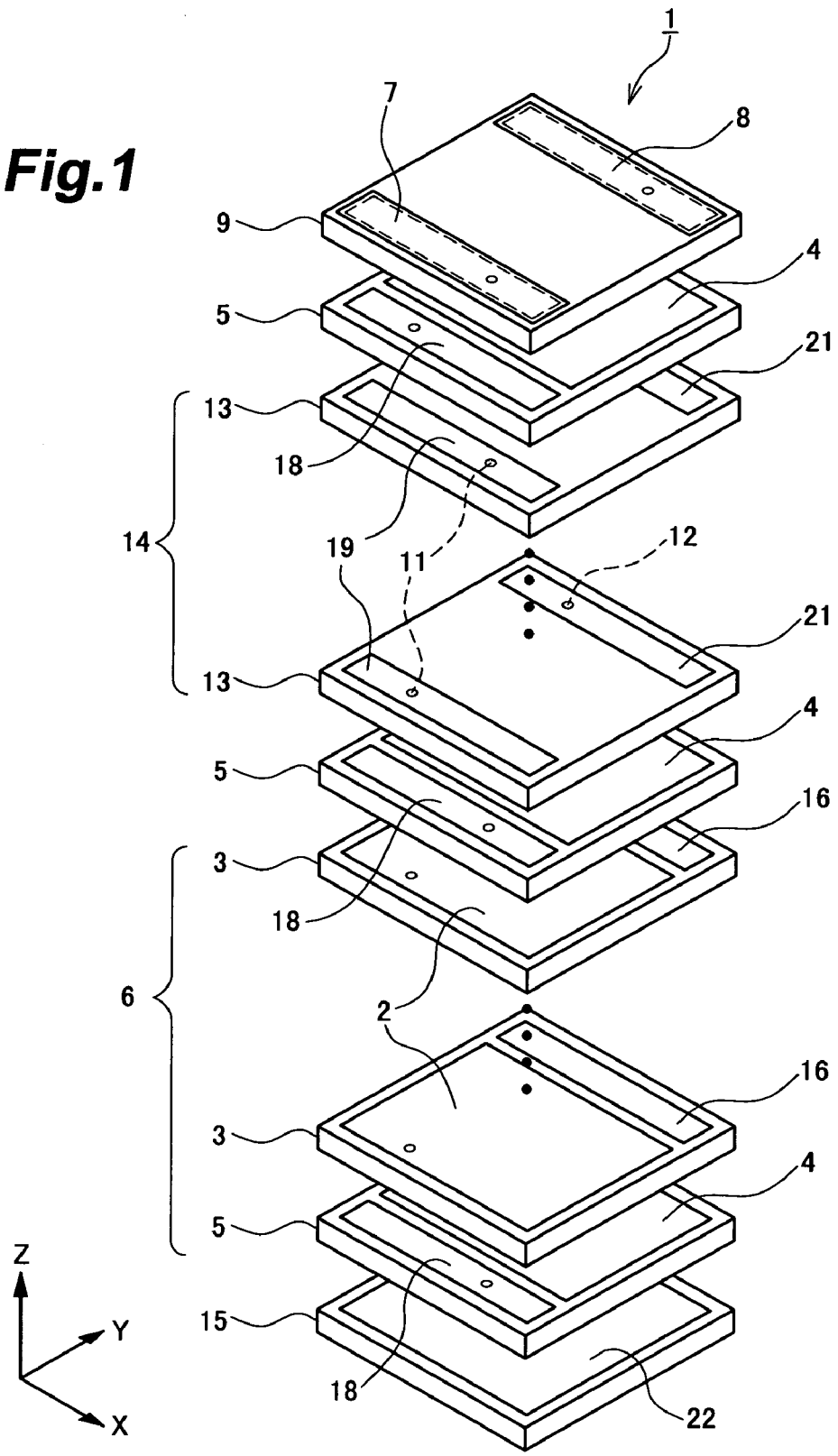
FIG. 1 is an exploded perspective view of a stack-type piezoelectric device of a first embodiment.

FIG. 1 is an exploded perspective view of a stack-type piezoelectric device of the first embodiment. As shown in the same figure, an XYZ coordinate system is set by defining the vertical direction along the stack direction of the stack-type piezoelectric device 1 and defining this stack direction as a Z-axis direction.

The stack-type piezoelectric device 1 has an active layer 6 consisting of an alternate stack of piezoelectric layers (first piezoelectric layers) 3 in each of which an anodic electrode (first internal electrode) 2 is formed, and piezoelectric layers (second piezoelectric layers) 5 in each of which a cathodic electrode (second internal electrode) 4 is formed; and a piezoelectric layer (third piezoelectric layer) 9 which is placed above the active layer 6 and in which a terminal electrode (first terminal electrode) 7 for applying a voltage to the anodic electrode 2 and a terminal electrode (second terminal electrode) 8 for applying a voltage to the cathodic electrode 4 are formed.

Placed between the active layer 6 and the piezoelectric layer 9 and on the upper side of the active layer 6 is an inactive layer 14 which consists of a stack of a plurality of piezoelectric layers (fourth piezoelectric layers) 13 in each of which a through hole (first through hole) 11 for electrical connection between the anodic electrode 2 and the terminal electrode 7, and a through hole (second through hole) 12 for electrical connection between the cathodic electrode 4 and the terminal electrode 8 are formed. Furthermore, a piezoelectric layer 5 is placed between this inactive layer 14 and the piezoelectric layer 9. In addition, a piezoelectric layer 15, to which a driven object such as a valve of a micropump is to be attached, is placed on the lower side of the active layer 6.

The active layer 6 consists of eighty nine layers of piezoelectric layers 3, 5 which are alternately stacked so that the uppermost layer and lowermost layer of the active layer 6 are the piezoelectric layers 5, and eight layers of piezoelectric layers 13 are stacked in a consecutive manner. Therefore, the stack-type piezoelectric device 1 is comprised of a stack of hundred piezoelectric layers 3, 5, 9, 13, and 15. Each piezoelectric layer 3, 5, 9, 13, 15 is made of a piezoelectric ceramic material consisting primarily of lead zirconate titanate and in a square thin plate shape of "8 mm×8 mm, and 80 μm thick."

Figure 2:
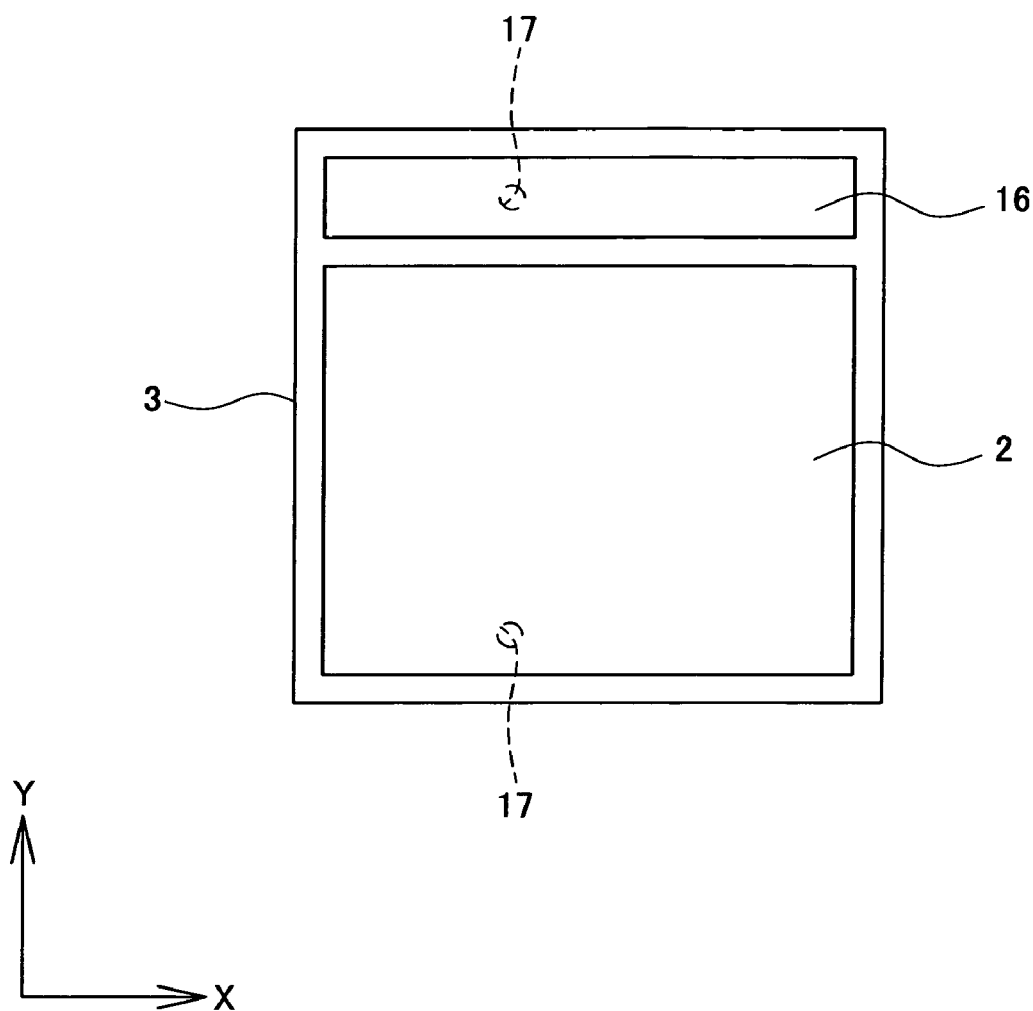
FIG. 2 is a plan view of piezoelectric layers in each of which an anodic electrode is formed, in an active layer of the stack-type piezoelectric device shown in FIG. 1.

Next, each of the piezoelectric layers 3, 5, 9, 13, and 15 will be described in more detail. As shown in FIG. 2, a relay electrode 16 of rectangular shape extending in the X-axis direction is formed on an upper surface of each piezoelectric layer 3 and in a marginal region on one end side in the Y-axis direction, and this relay electrode 16 is connected to an electroconductive member in a through hole 17 formed immediately below it in the piezoelectric layer 3. Furthermore, in the region without the relay electrode 16 on the upper surface of the piezoelectric layer 3, an anodic electrode 2 is formed in a rectangular shape with a predetermined clearance from the relay electrode 16 and from the peripheral part of the piezoelectric layer 3. This anodic electrode 2 is connected to an electroconductive member in a through hole 17 formed in a marginal region on the other end side in the Y-axis direction in the piezoelectric layer 3.

Figure 3:
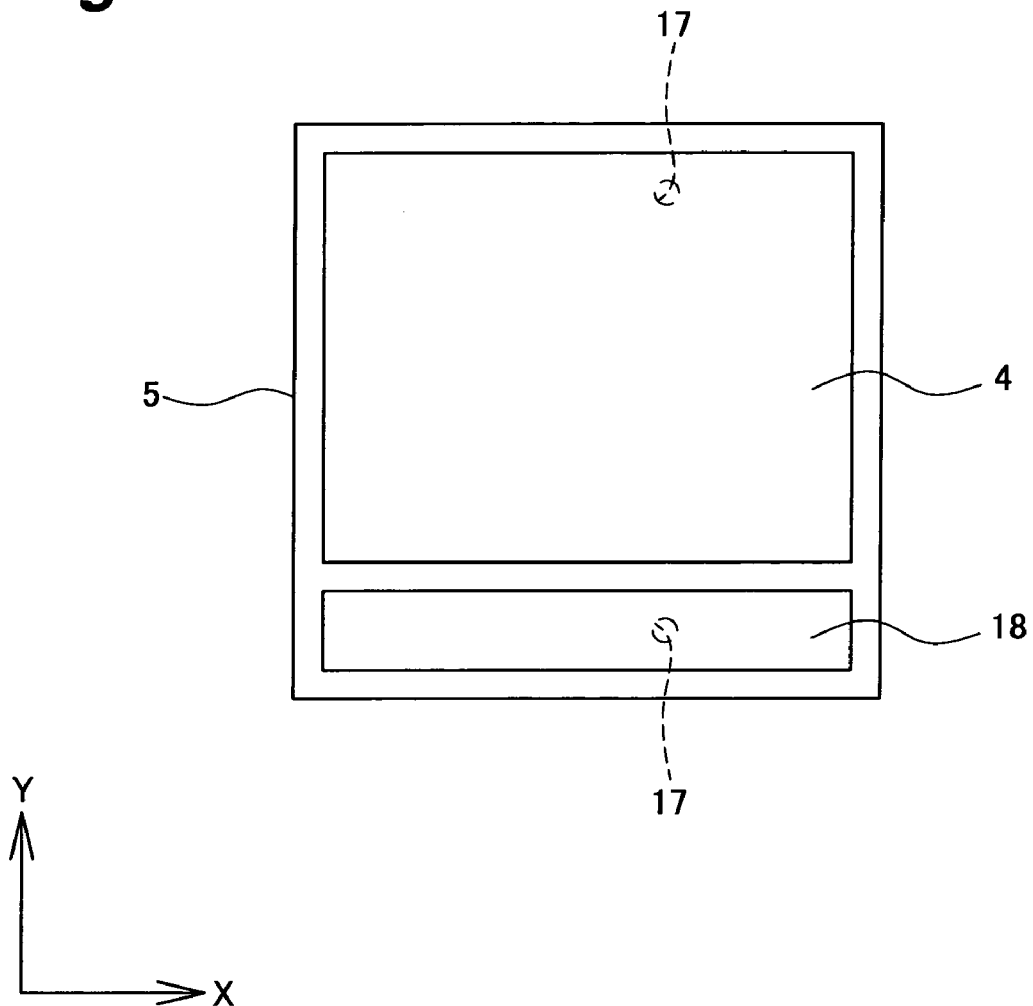
FIG. 3 is a plan view of piezoelectric layers in each of which a cathodic electrode is formed, in the active layer of the stack-type piezoelectric device shown in FIG. 1.

As shown in FIG. 3, a relay electrode 18 of rectangular shape extending in the X-axis direction is formed on an upper surface of each piezoelectric layer 5 and in a marginal region on the other end side in the Y-axis direction, and this relay electrode 18 is connected to an electroconductive member in a through hole 17 formed immediately below it in the piezoelectric layer 5. Furthermore, in the region without the relay electrode 18 on the upper surface of the piezoelectric layer 5, a cathodic electrode 4 is formed in a rectangular shape with a predetermined clearance from the relay electrode 18 and from the peripheral part of the piezoelectric layer 5. This cathodic electrode 4 is connected to an electroconductive member in a through hole 17 formed in, a marginal region on one end side in the Y-axis direction in the piezoelectric layer 5. The lowermost piezoelectric layer 5 of the active layer 6 is different from the other piezoelectric layers 5 in that there is no through hole 17 formed in the marginal region on one end side in the Y-axis direction.

Figure 4:
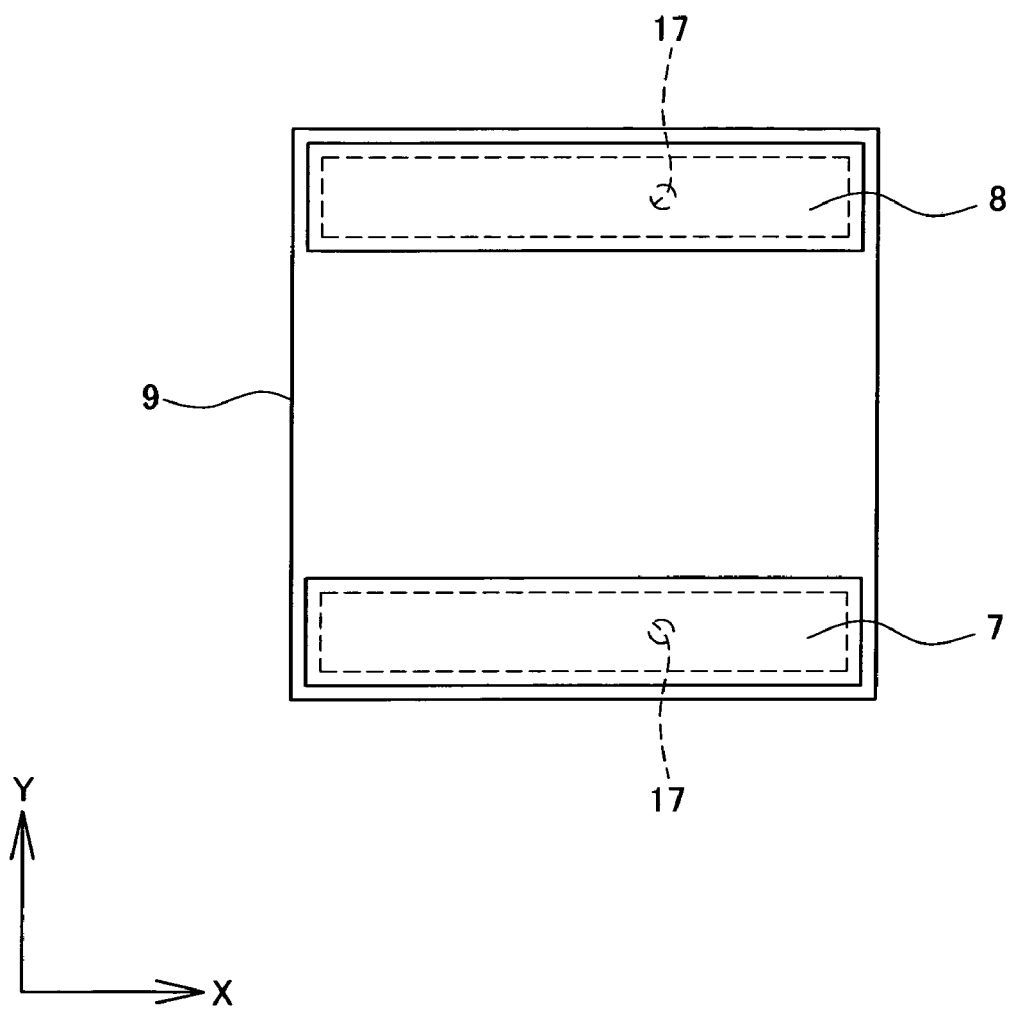
FIG. 4 is a plan view of an uppermost piezoelectric layer in which terminal electrodes are formed, in the stack-type piezoelectric device shown in FIG. 1.

As shown in FIG. 4, terminal electrodes 7, 8 of rectangular shape extending in the X-axis direction are formed on an upper surface of the uppermost piezoelectric layer 9. The terminal electrode 7 faces the relay electrodes 18 of the piezoelectric layers 5 in the stack direction, and the terminal electrode 8 faces the relay electrodes 16 of the piezoelectric layers 3 in the stack direction. Each terminal electrode 7, 8 is connected to an electroconductive member in a through hole 17 formed immediately below it in the piezoelectric layer 9. Lead wires for connection to a drive power supply are soldered to these terminal electrodes 7, 8.

Figure 5:
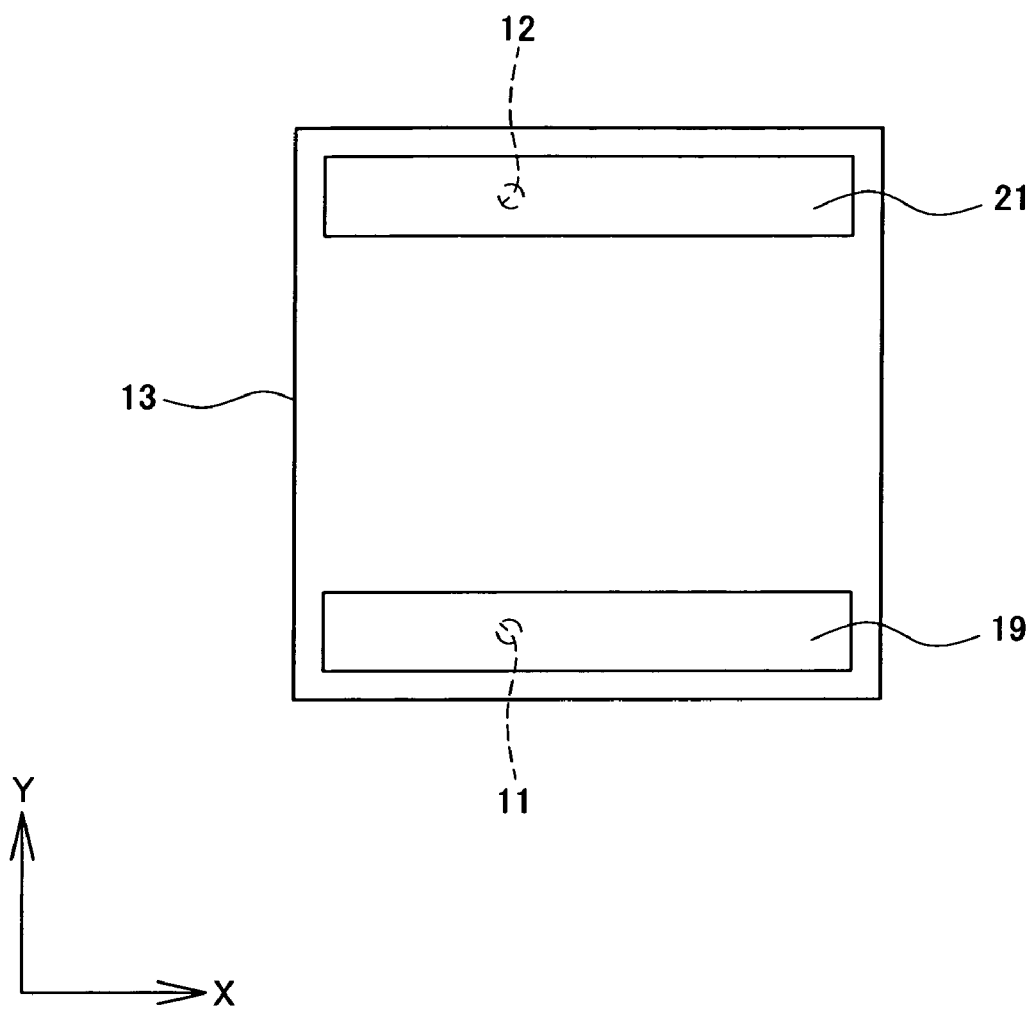
FIG. 5 is a plan view of piezoelectric layers in which relay electrodes are formed, in an inactive layer of the stack-type piezoelectric device shown in FIG. 1.

As shown in FIG. 5, a relay electrode (first relay electrode) 19 of rectangular shape extending in the X-axis direction is formed on an upper surface of each piezoelectric layer 13 so as to face the relay electrodes 18 of the piezoelectric layers 5 in the stack direction. Furthermore, a relay electrode (second relay electrode) 21 of rectangular shape extending in the X-axis direction is formed on the upper surface of the piezoelectric layer 13 so as to face the relay electrodes 16 of the piezoelectric layers 3 in the stack direction. The relay electrode 19 is connected to an electroconductive member in a through hole 11 formed immediately below it in the piezoelectric layer 13, and the relay electrode 21 to an electroconductive member in a through hole 12 formed immediately below it in the piezoelectric layer 13.

Figure 6:
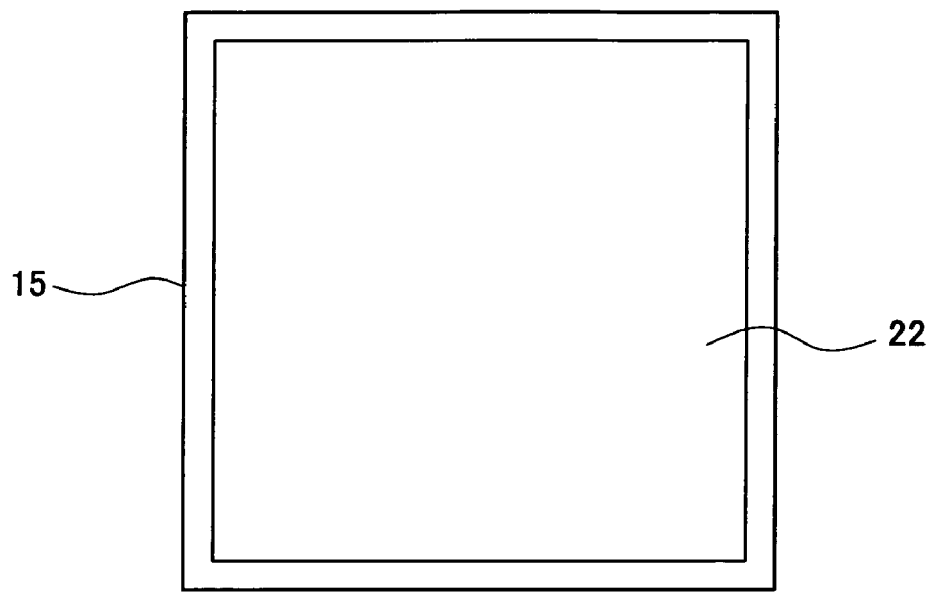
FIG. 6 is a plan view of a lowermost piezoelectric layer in which an anodic electrode is formed, in the stack-type piezoelectric device shown in FIG. 1.

As shown in FIG. 6, an anodic electrode 22 having a contour overlapping with the anodic electrodes 2 of the piezoelectric layers 3 and the cathodic electrodes 4 of the piezoelectric layers 5 when viewed from the stack direction is formed on an upper surface of the lowermost piezoelectric layer 15 and with a predetermined clearance from the peripheral part of the piezoelectric layer 15.

Figure 7:
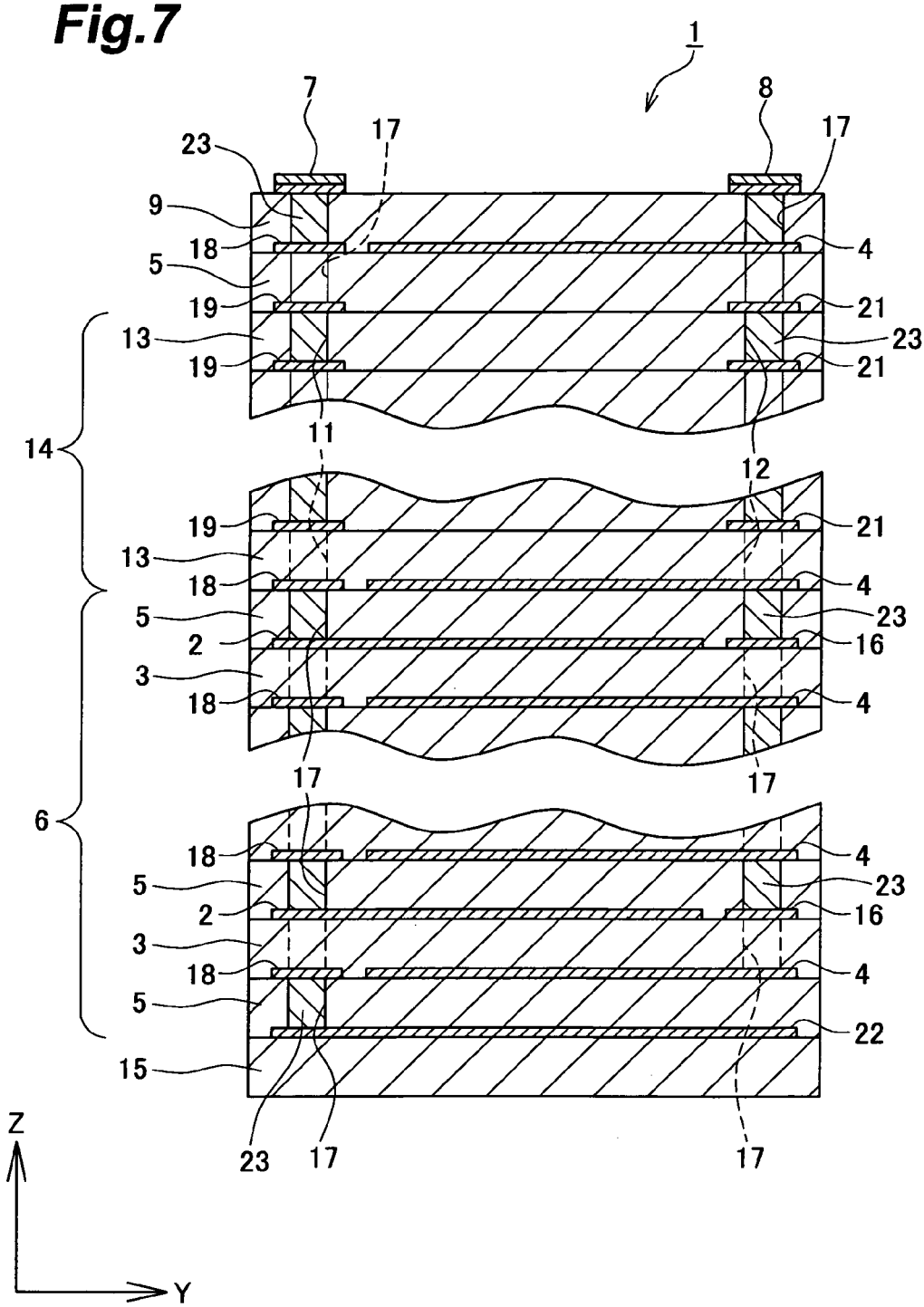
FIG. 7 is a sectional view along the direction normal to the X-axis direction of the stack-type piezoelectric device shown in FIG. 1.

As the piezoelectric layers 3, 5, 9, 13, and 15 with the electrode patterns formed as described above are stacked, the anodic electrodes 2, 22 and relay electrodes 18, 19 are aligned in the stack direction with the terminal electrode 7 of the uppermost layer, as shown in FIG. 7, and the electrodes 2, 18, 19, and 22 thus aligned are electrically connected by the electroconductive members 23 in the through holes 11, 17. On the other hand, the cathodic electrodes 4 and relay electrodes 16, 21 are aligned in the stack direction with the terminal electrode 8 of the uppermost layer and the electrodes 4, 16, and 21 thus aligned are electrically connected by the electroconductive members 23 in the through holes 12, 17.

With this electrical connection in the stack-type piezoelectric device 1, when a voltage is applied between the terminal electrode 7 and the terminal electrode 8, the voltage is also applied between the anodic electrodes 2, 22 and the cathodic electrodes 4. This results in establishing electric fields in portions between the anodic electrodes 2, 22 and the cathodic electrodes 4 in the piezoelectric layers 3, 5 of the active layer 6, and the portions are displaced as active parts in the stack direction.

In the stack-type piezoelectric device 1, as described above, the inactive layer 14 placed between the active layer 6 with the anodic electrodes 2 and cathodic electrodes 4 and the piezoelectric layer 9 with the terminal electrodes 7, 8 is comprised of a stack of plural piezoelectric layers 13 with the through holes 11, 12 formed therein. For this reason, the inactive layer 14 can be constructed in such a thickness that the displacement of the active layer 6 can be securely transmitted to the piezoelectric layer 15 side (i.e., to the side where a driven object is to be attached), in such a manner that each piezoelectric layer 13 is formed in a thickness as small as the electroconductive member 23 can be securely placed in each through hole 11, 12 (e.g., in a case where the inside diameter of the through holes 11, 12 is not more than 50 μm, the thickness of the piezoelectric layers 13 is preferably not more than 100 μm) and that a plurality of such piezoelectric layers 13 are stacked to form the inactive layer 14. This allows the electroconductive members 23 to be securely placed in the through holes 11, 12 formed in the inactive layer 14, so that the anodic electrodes 2 and the terminal electrode 7 can be securely connected by the electroconductive members 23 through the through holes 11 and, similarly, the cathodic electrodes 4 and the terminal electrode 8 can be securely connected through the through holes 12.

Each of the piezoelectric layers 13 forming the inactive layer 14 has the relay electrode 19 connected to the electroconductive member 23 in the through hole 11 and the relay electrode 21 connected to the electroconductive member 23 in the through hole 12. This permits the through holes 11, 11 adjacent through the relay electrode 19 in the stack direction to be formed as shifted in the region of the relay electrode 19 (so as not to be aligned on a straight line), as shown in FIG. 7, so that secure connection can be established between the electroconductive members 23 in the through holes 11, 11 adjacent in the stack direction and the relay electrode 19. Similarly, it becomes feasible to establish secure connection between the relay electrode 21 and the electroconductive members 23 in the through holes 12, 12 adjacent in the stack direction. Since in the stack-type piezoelectric device 1 the other through holes 17 are also formed so as not to be aligned on a straight line, secure connection is also established between each electrode 2, 4, 16, 18 and the electroconductive member 23 in each through hole 17.

The following effect is presented by the placement of the piezoelectric layer 5 between the inactive layer 14 and the piezoelectric layer 9. Namely, if only the piezoelectric layers 13 forming the inactive layer 14 should be stacked without the placement of the piezoelectric layer 5, the stack-type piezoelectric device 1 could be deformed by difference of contraction percentage between the piezoelectric layers 13 and the relay electrodes 19, 21, because the relay electrodes 19, 21 are formed only in the both marginal regions on the upper surface of the piezoelectric layers 13. By placing the piezoelectric layer 5 with the cathodic electrode 4 and relay electrode 18 being formed over the almost entire region of the upper surface on the upper side of the inactive layer 14, the foregoing deformation of the stack-type piezoelectric device 1 can be prevented.

Next, a production procedure of the stack-type piezoelectric device 1 described above will be described. First, a substrate paste is prepared by mixing an organic binder, an organic solvent, etc. into a piezoelectric ceramic material consisting primarily of lead zirconate titanate, and green sheets for the respective piezoelectric layers 3, 5, 9, 13, and 15 are formed using the substrate paste. An electroconductive paste is also prepared by mixing an organic binder, an organic solvent, etc. into a material consisting primarily of silver and palladium.

Subsequently, laser light is applied to predetermined positions on the green sheets for the respective piezoelectric layers 3, 5, 9, 13, and 15 to form the through holes 11, 12, and 17. Then filling screen print with the electroconductive paste is carried out into the through holes 11, 12, and 17 to form the electroconductive members 23. Thereafter, screen print with the electroconductive paste is carried out on the green sheets for the respective piezoelectric layers 3, 5, 13, 15 to form the electrodes 2, 4, 16, 18, 19, 21, and 22. Screen print with the electroconductive paste is also carried out on the green sheet for the uppermost piezoelectric layer 9 to form ground electrodes.

Subsequently, the green sheets with the electrode patterns thereon are stacked in the aforementioned order and pressed in the stack direction to fabricate a green laminate. This green laminate is degreased and baked, and thereafter, baked electrodes of silver are placed on the ground electrodes of the sintered sheet for the piezoelectric layer 9 to form the terminal electrodes 7, 8. Thereafter, a polarization process is carried out to complete the stack-type piezoelectric device 1. Gold, copper, or the like may also be used as the material of the terminal electrodes 7, 8. The terminal electrodes 7, 8 may also be formed by another method such as sputtering, electroless plating, or the like.

[Second Embodiment]

Figure 8:
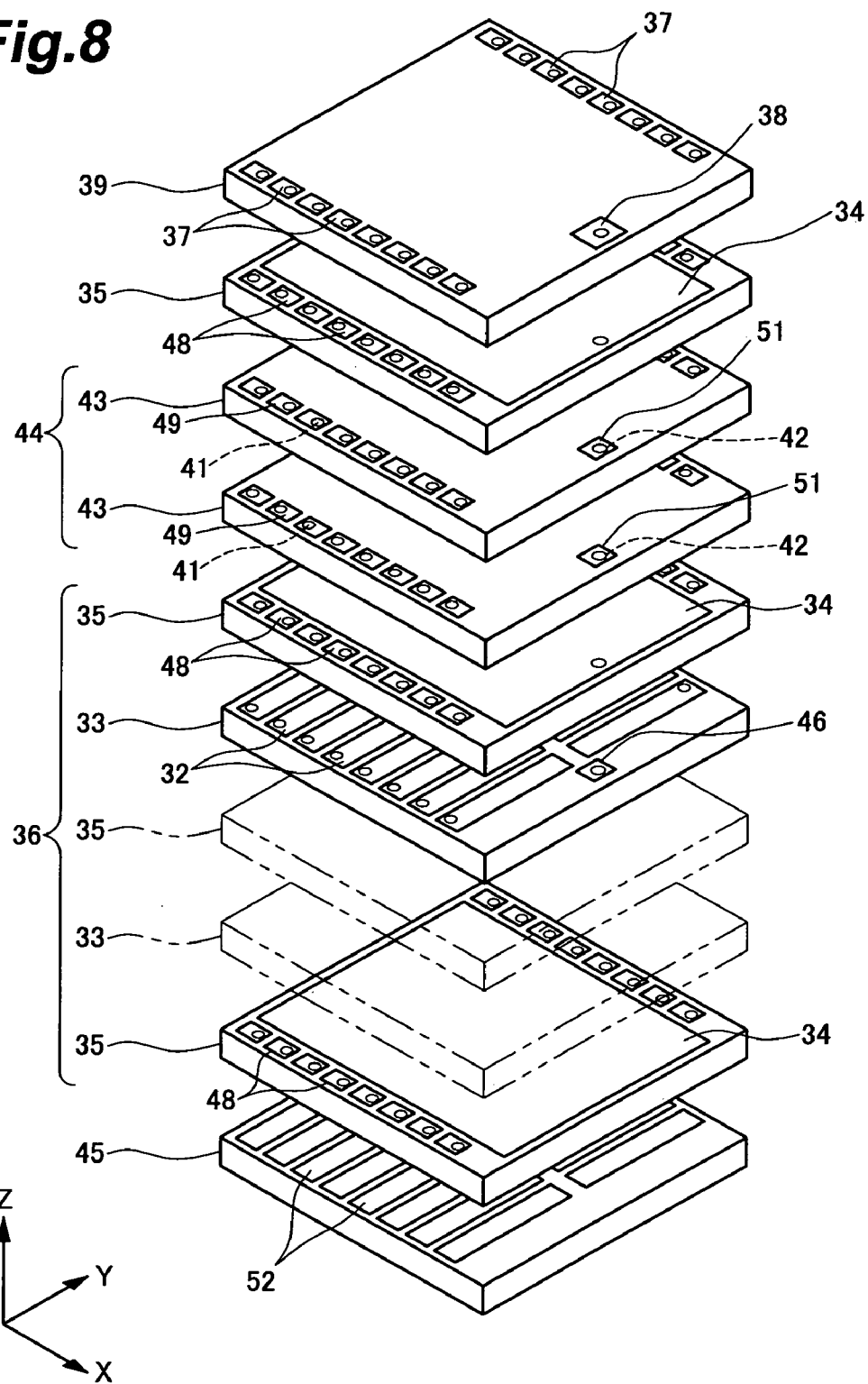
FIG. 8 is an exploded perspective view of a stack-type piezoelectric device of a second embodiment.

FIG. 8 is an exploded perspective view of a stack-type piezoelectric device of the second embodiment. As shown in the same figure, an XYZ coordinate system is set by defining the vertical direction along a stack direction of the stack-type piezoelectric device 31 and defining this stack direction as a Z-axis direction.

The stack-type piezoelectric device 31 has an active layer 36 consisting of an alternate stack of piezoelectric layers (first piezoelectric layers) 33 in each of which individual electrodes (first internal electrodes) 32 are formed, and piezoelectric layers (second piezoelectric layers) 35 in each of which a common electrode (second internal electrode) 34 is formed; and a piezoelectric layer (third piezoelectric layer) 39 which is placed above the active layer 36 and in which a terminal electrode (first terminal electrode) 37 for applying a voltage to the individual electrodes 32 and a terminal electrode (second terminal electrode) 38 for applying a voltage to the common electrode 34 are formed.

Placed between the active layer 36 and the piezoelectric layer 39 and on the upper side of the active layer 36 is an inactive layer 44 consisting of a stack of plural piezoelectric layers (fourth piezoelectric layers) 43 in each of which through holes (first through holes) 41 for electrical connection between the individual electrodes 32 and the terminal electrode 37, and a through hole (second through hole) 42 for electrical connection between the common electrodes 34 and the terminal electrode 38 are formed. Furthermore, one piezoelectric layer 35 is placed between this inactive layer 44 and the piezoelectric layer 39. A piezoelectric layer 45, to which a driven object such as a valve of a micropump is to be attached, is placed on the lower side of the active layer 36.

Five layers of piezoelectric layers 33, 35 are alternately stacked in the active layer 36 so that the uppermost layer and lowermost layer of the active layer 36 are the piezoelectric layers 35, and two layers of piezoelectric layers 43 are stacked in a consecutive manner. Therefore, the stack-type piezoelectric device 31 is constructed of a stack of ten layers of piezoelectric layers 33, 35, 39, 43, and 45. Each of the piezoelectric layers 33, 35, 39, 43, and 45 is made of a piezoelectric ceramic material consisting primarily of lead zirconate titanate and in a square thin plate shape of "12 mm×12 mm, and 80 μm thick."

Figure 9:
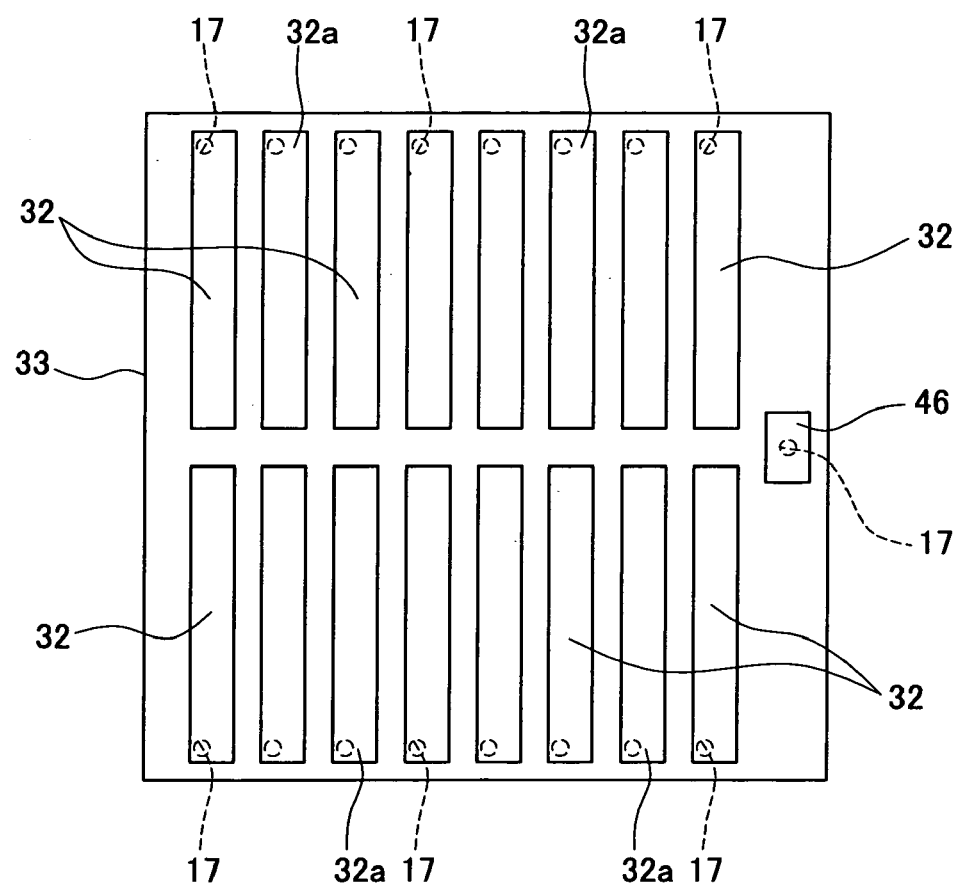
FIG. 9 is a plan view of piezoelectric layers in each of which individual electrodes are formed, in an active layer of the stack-type piezoelectric device shown in FIG. 8.

Next, each of the piezoelectric layers 33, 35, 39, 43, and 45 will be described in more detail. As shown in FIG. 9, a number of individual electrodes 32 of rectangular shape are placed in a matrix on an upper surface of each piezoelectric layer 33. Each individual electrode 32 is placed so that its longitudinal direction extends along the Y-axis direction, and adjacent individual electrodes 32, 32 are placed with a predetermined space so as to achieve electrical independence of each other and to prevent influence of each other's vibrations.

Under such definitions that the X-axis direction agrees with a row direction and the Y-axis direction with a column direction, the individual electrodes 32 are arranged in a matrix of two rows and eight columns. As a number of individual electrodes 32 are arranged in the matrix as described above, it becomes feasible to implement efficient placement on each piezoelectric layer 33, and it is thus feasible to achieve miniaturization of the stack-type piezoelectric device 31 or high integration of individual electrodes 32, while maintaining the area of active parts contributing to vibration in the piezoelectric layer 33.

Each of the individual electrodes 32 in the first row and in the second row has a connection end 32a at an outside end in the Y-axis direction, and each individual electrode is connected to an electroconductive member in a through hole 17 formed immediately below the connection end 32a in the piezoelectric layer 33.

Furthermore, a relay electrode 46 for electrical connection with common electrodes 34, 34 of piezoelectric layers 35 located up and down is formed in a marginal region on the upper surface of the piezoelectric layer 33. This relay electrode 46 is connected to an electroconductive member in a through hole 17 formed immediately below it in the piezoelectric layer 33.

Figure 10:
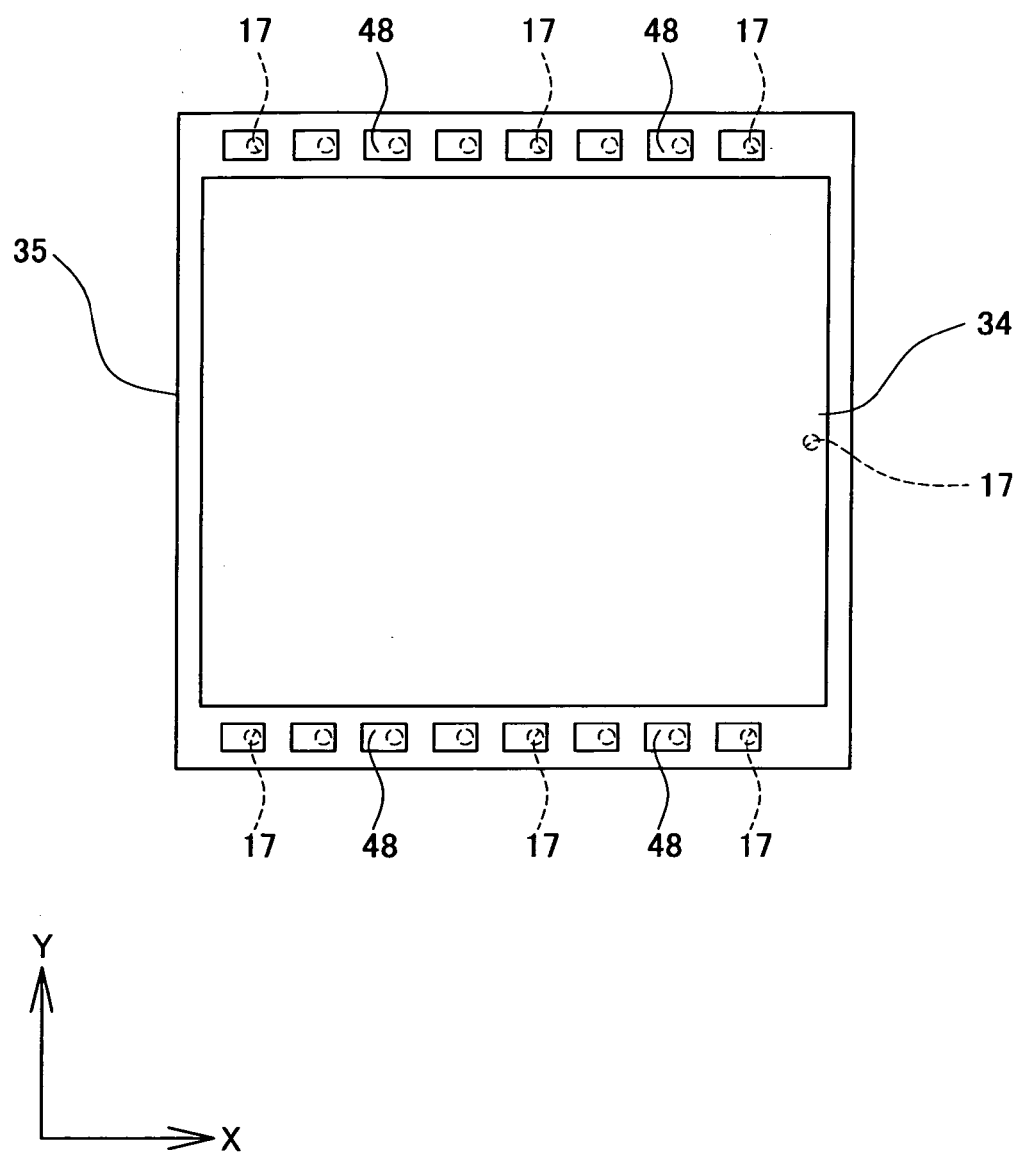
FIG. 10 is a plan view of piezoelectric layers in each of which a common electrode is formed, in the active layer of the stack-type piezoelectric device shown in FIG. 8.

As shown in FIG. 10, relay electrodes 48 are formed on an upper surface of each piezoelectric layer 35 so as to face the respective connection ends 32a of the piezoelectric layers 33 in the stack direction. Each relay electrode 48 is connected to an electroconductive member in a through hole 17 formed immediately below it in the piezoelectric layer 35.

Furthermore, a common electrode 34 of rectangular shape is formed on the upper surface of the piezoelectric layer 35 so as to be placed between the relay electrodes 48 in the first row and the relay electrodes 48 in the second row. This common electrode 34 overlaps with the portions except for the connection ends 32a of the respective individual electrodes 32, when viewed from the stack direction. This allows the whole of the portions facing the portions except for the connection ends 32a of the respective individual electrodes 32 in the piezoelectric layers 33, 35 to be effectively used as active parts contributing to vibration.

The common electrode 34 is connected to an electroconductive member in a through hole 17 formed in the piezoelectric layer 35 so as to face the relay electrodes 46 of the piezoelectric layers 33 in the stack direction. However, the lowermost piezoelectric layer 35 of the active layer 36 is formed without the through hole 17 facing the relay electrodes 46 of the piezoelectric layers 33 in the stack direction.

Figure 11:
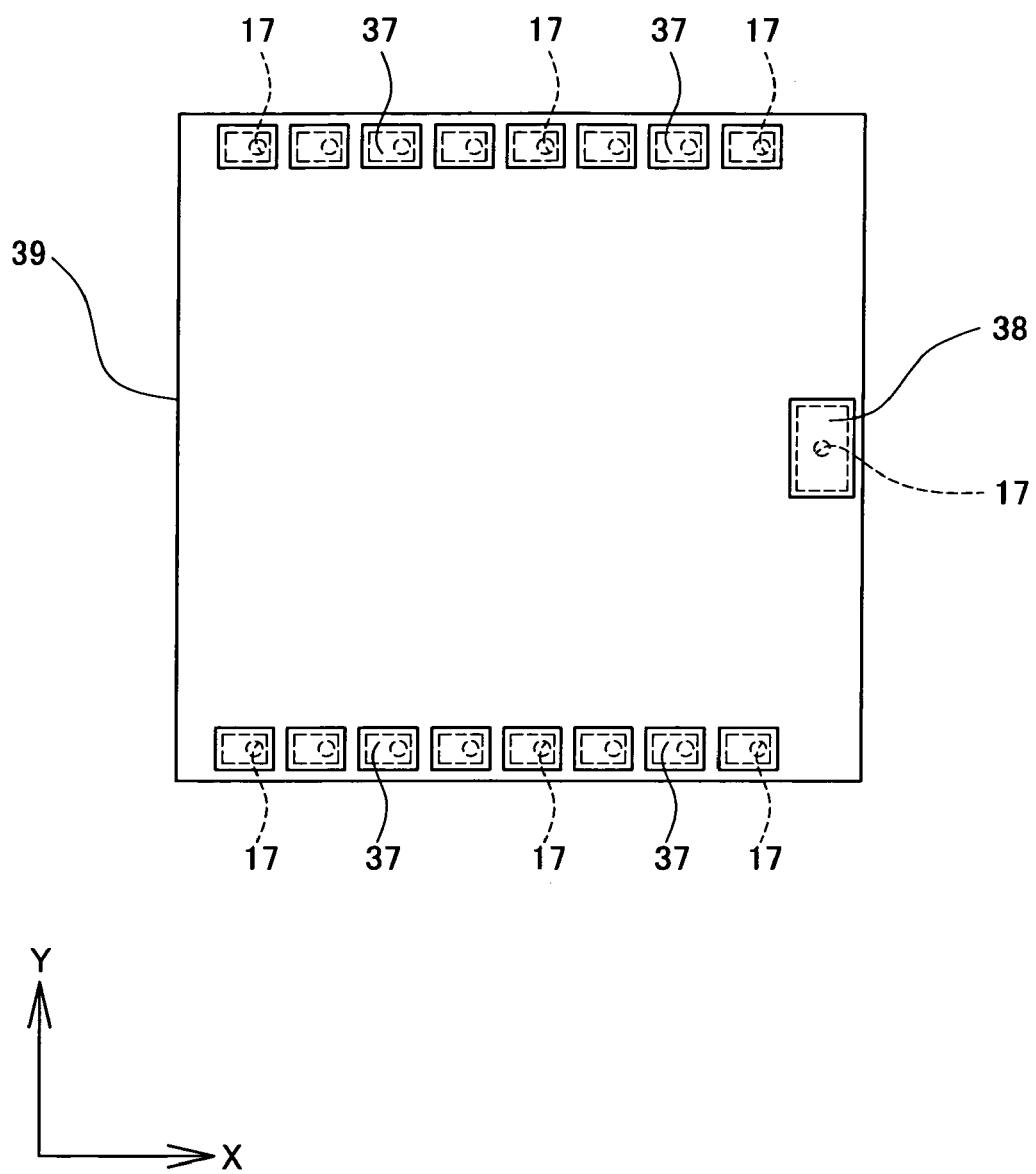
FIG. 11 is a plan view of an uppermost piezoelectric layer in which terminal electrodes are formed, in the stack-type piezoelectric device shown in FIG. 8.

As shown in FIG. 11, terminal electrodes 37 are formed on the upper surface of the uppermost piezoelectric layer 39 so as to face the respective relay electrodes 48 of the piezoelectric layers 35 in the stack direction, and a terminal electrode 38 is formed so as to face the relay electrodes 46 of the piezoelectric layers 33 in the stack direction. Each terminal electrode 37, 38 is connected to an electroconductive member in a through hole 17 formed immediately below it in the piezoelectric layer 39. Lead wires for connection to a drive power supply are soldered to these terminal electrodes 37, 38.

Figure 12:
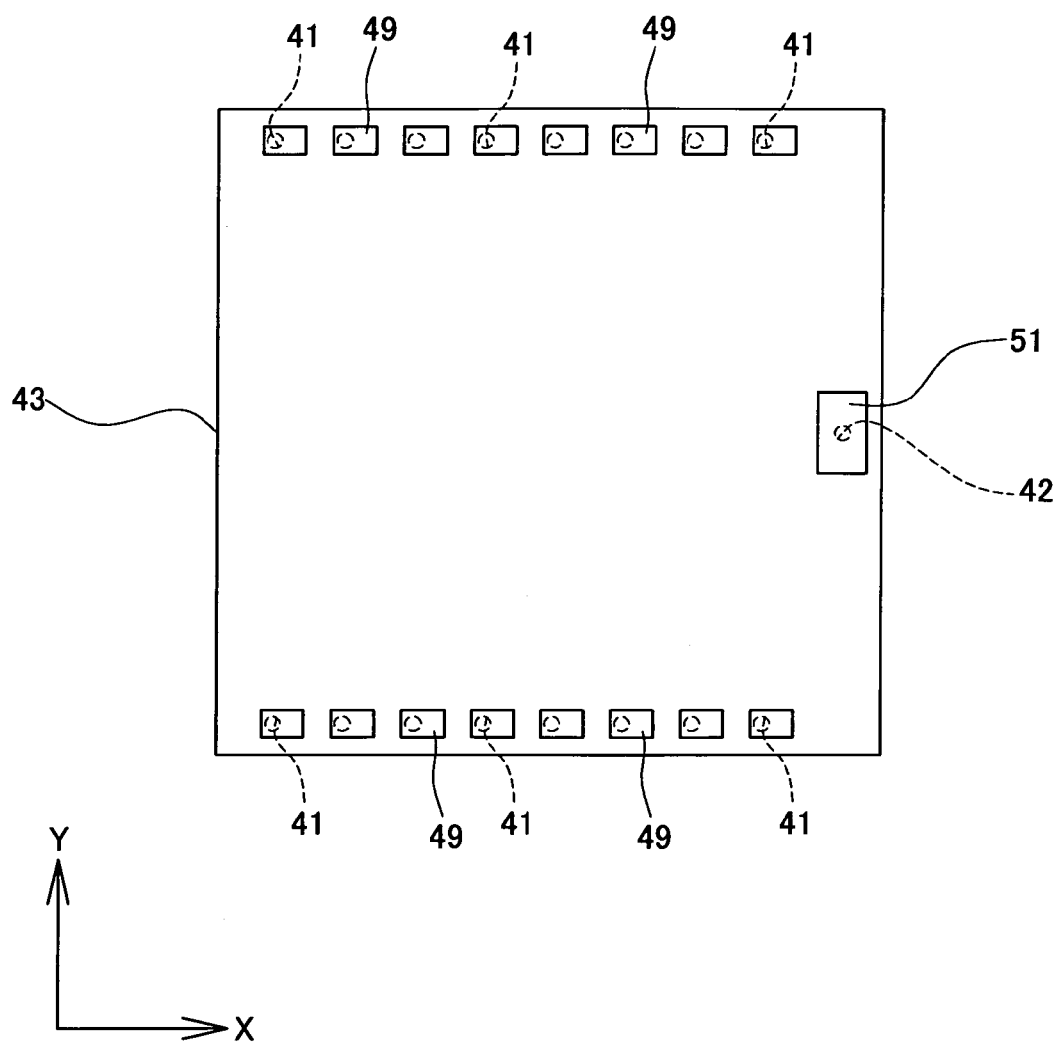
FIG. 12 is a plan view of piezoelectric layers in each of which relay electrodes are formed, in an inactive layer of the stack-type piezoelectric device shown in FIG. 8.

As shown in FIG. 12, relay electrodes (first relay electrodes) 49 are formed on an upper surface of each piezoelectric layer 43 so as to face the relay electrodes 48 of the piezoelectric layers 35 in the stack direction, and a relay electrode (second relay electrode) 51 is formed so as to face the relay electrodes 46 of the piezoelectric layers 33 in the stack direction. Each relay electrode 49 is connected to an electroconductive member in a through hole 41 formed immediately below it in the piezoelectric layer 43, and the relay electrode 51 to an electroconductive member in a through hole 42 formed immediately below it in the piezoelectric layer 43.

Figure 13:
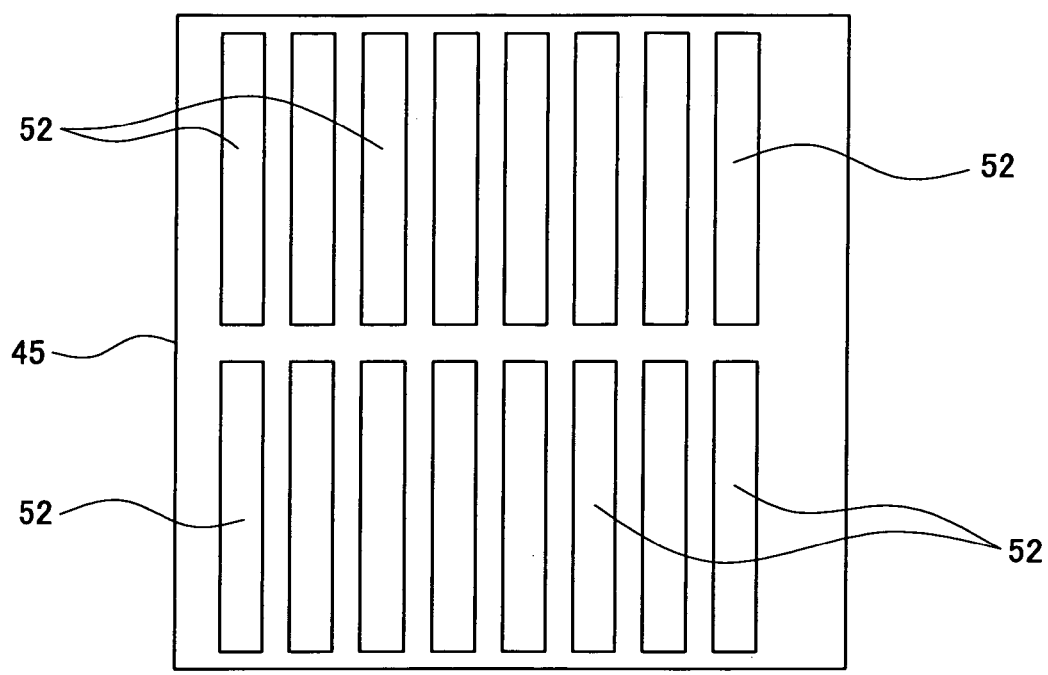
FIG. 13 is a plan view of a lowermost piezoelectric layer in which individual electrodes are formed, in the stack-type piezoelectric device shown in FIG. 8.

As shown in FIG. 13, individual electrodes 52 of a shape equivalent to that of the individual electrodes 32 are formed on the upper surface of the lowermost piezoelectric layer 45 so as to face the respective individual electrodes 32 of the piezoelectric layers 33 in the stack direction.

Figure 14:
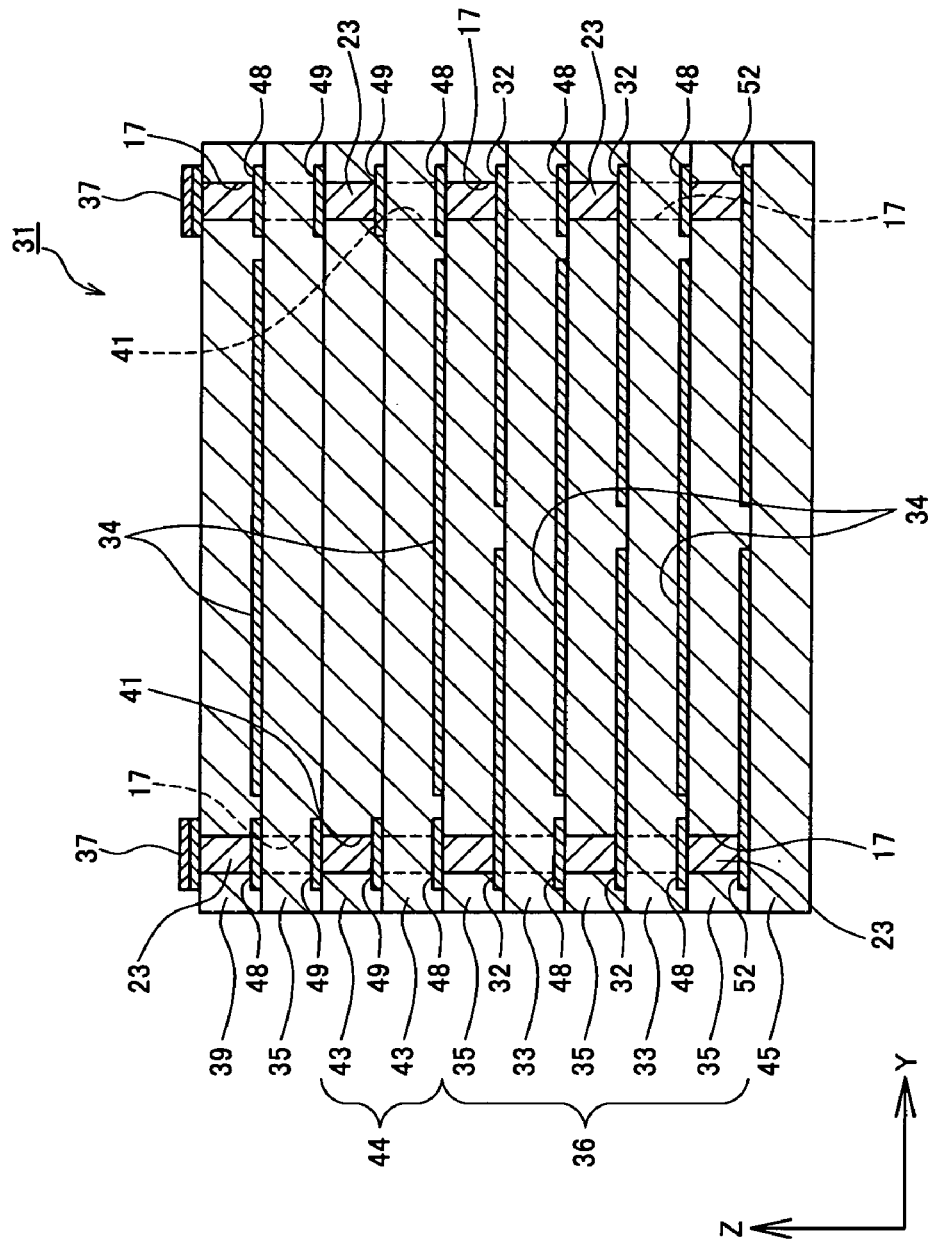
FIG. 14 is a sectional view along the direction normal to the X-axis direction of the stack-type piezoelectric device shown in FIG. 8.

As the piezoelectric layers 33, 35, 39, 43, and 45 with the electrode patterns formed as described above are stacked, the individual electrodes 32, 52 and the relay electrodes 48, 49 are aligned in the stack direction with the terminal electrodes 37 of the uppermost layer, as shown in FIG. 14, and the electrodes 32, 48, 49, and 52 thus aligned are electrically connected by the electroconductive members 23 in the through holes 41, 17. On the other hand, the common electrodes 34 and relay electrodes 46, 51 are aligned in the stack direction with the terminal electrode 38 of the uppermost layer, and the electrodes 34, 46, 51 thus aligned are electrically connected by the electroconductive members 23 in the through holes 42, 17.

With the electrical connection in the stack-type piezoelectric device 31 as described above, when a voltage is applied between a predetermined terminal electrode 37 and the terminal electrode 38, the voltage is also applied between individual electrodes 32, 52 aligned under the predetermined terminal electrode 37, and the common electrodes 34. This results in establishing electric fields in portions between the individual electrodes 32, 52 and the common electrodes 34 under application of the voltage in the piezoelectric layers 33, 35 of the active layer 36, and the portions are displaced as active parts in the stack direction.

In the stack-type piezoelectric device 31, as described above, the inactive layer 44 placed between the active layer 36 with the individual electrodes 32 and common electrodes 34 and the piezoelectric layer 39 with the terminal electrodes 37, 38 is also constructed of a stack of plural piezoelectric layers 43 with the through holes 41, 42 formed therein. Therefore, just as in the case of the stack-type piezoelectric device 1 of the first embodiment, secure connection can be established between the individual electrodes 32 and the terminal electrodes 37 by the electroconductive members 23 through the through holes 41, and secure connection can also be established between the common electrodes 34 and the terminal electrode 38 through the through holes 42.

The stack-type piezoelectric device 31 described above is also fabricated by a production procedure similar to that of the stack-type piezoelectric device 1 of the first embodiment.

The present invention is suitably applicable to cases where an inactive layer is placed between an active layer with internal electrodes and a piezoelectric layer with terminal electrodes, whereby secure electrical connection can be established between the internal electrodes and the terminal electrodes through through holes formed in the inactive layer.

What is claimed is:

1. A stack-type piezoelectric device comprising:

an active layer consisting of an alternate stack of first piezoelectric layers in each of which a first internal electrode is formed, and second piezoelectric layers in each of which a second internal electrode is formed, the active layer being displaced in a stack direction when a voltage is applied between the first internal electrode and the second internal electrode; and a third piezoelectric layer in which a first terminal electrode for applying a voltage to the first internal electrode, and a second terminal electrode for applying a voltage to the second internal electrode are formed, wherein an inactive layer is placed between the active layer and the third piezoelectric layer, and wherein the inactive layer comprises a stack of a plurality of fourth piezoelectric layers in each of which a first through hole for electrical connection between the first internal electrode and the first terminal electrode, and a second through hole for electrical connection between the second internal electrode and the second terminal electrode are formed.

2. The stack-type piezoelectric device according to claim 1, wherein each of the fourth piezoelectric layers comprises a first relay electrode connected, to an electroconductive member in the first through hole, and a second relay electrode connected to an electroconductive member in the second through hole.

* * * * *